United States Patent
Hiroshima

(10) Patent No.: US 8,308,961 B2
(45) Date of Patent: Nov. 13, 2012

(54) METHOD OF PRODUCING A MOLD FOR IMPRINT LITHOGRAPHY, AND MOLD

(75) Inventor: Hiroshi Hiroshima, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 251 days.

(21) Appl. No.: 12/673,381

(22) PCT Filed: Jul. 28, 2008

(86) PCT No.: PCT/JP2008/063490
§ 371 (c)(1),
(2), (4) Date: Feb. 12, 2010

(87) PCT Pub. No.: WO2009/037921
PCT Pub. Date: Mar. 26, 2009

(65) Prior Publication Data
US 2011/0159134 A1 Jun. 30, 2011

(30) Foreign Application Priority Data
Sep. 19, 2007 (JP) .................. 2007-242734

(51) Int. Cl.
*C25F 3/00* (2006.01)
(52) U.S. Cl. ............... 216/11; 216/52; 216/62; 216/41; 430/5
(58) Field of Classification Search ............ 101/368, 101/485; 117/2; 216/41, 51, 52, 62; 257/208, 257/211; 264/219, 319, 496; 356/614; 359/457; 425/150, 174.4, 385; 430/312, 316, 320, 430/322, 323, 5; 435/6.12; 438/271, 3, 424, 438/427, 618, 637, 669, 689, 735
See application file for complete search history.

(56) References Cited

U.S. PATENT DOCUMENTS
3,542,551 A * 11/1970 Rice .............................. 430/312
(Continued)

FOREIGN PATENT DOCUMENTS
JP 2003-22585 A 1/2003
(Continued)

OTHER PUBLICATIONS

Japanese Office Action mailed Dec. 6, 2011 issued in corresponding Japanese Patent Application No. 2007-242734 (English translation is attached).

(Continued)

*Primary Examiner* — Duy Deo
*Assistant Examiner* — Erin Flanagan
(74) *Attorney, Agent, or Firm* — Birch, Stewart, Kolasch & Birch, LLP

(57) ABSTRACT

In order to prevent occurrence of a residual film distribution dependent upon a pattern density of a mold, in producing the mold to be used for imprint lithography, by etching using a mask, use is made of a first mask M1 for forming a desired pattern to be formed on a surface of the mold, and a second mask M2 for partially covering the first mask such that the area covering openings of the first mask is made larger as an opening ratio of the pattern formed on the first mold surface is higher, thereby to make a volume of a recess of the mold in a given area; in which, after the mold is etched by the first mask, etching is further conducted by covering partially the first mask with the second mask without removing the first mask; or alternatively, the etching is conducted with the first mask and the second mask overlapped from the beginning, thereby to use the second mask as a mask for delaying the etching, for conduct the etching.

3 Claims, 7 Drawing Sheets

U.S. PATENT DOCUMENTS

| | | | |
|---|---|---|---|
| 7,256,435 B1 * | 8/2007 | Kornilovich et al. | 257/208 |
| 2004/0029385 A1 * | 2/2004 | Manger et al. | 438/689 |
| 2006/0230959 A1 | 10/2006 | Meijer et al. | |
| 2007/0176320 A1 | 8/2007 | Nakamura et al. | |
| 2010/0108639 A1 * | 5/2010 | Kasono | 216/41 |

FOREIGN PATENT DOCUMENTS

| | | |
|---|---|---|
| JP | 2005-293730 A | 10/2005 |
| JP | 2006-303503 A | 11/2006 |
| JP | 2007-95116 A | 4/2007 |
| JP | 2007-122802 A | 5/2007 |
| JP | 2007-140460 A | 6/2007 |
| JP | 2007-230229 A | 9/2007 |

OTHER PUBLICATIONS

Japanese Office Action mailed Feb. 28, 2012 issued in corresponding Japanese Patent Application No. 2007-242734 (English translation is attached).

Japanese Office Action mailed May 24, 2011 issued in corresponding Japanese Application No. 2007-242734 (English translation is attached).

* cited by examiner

Imprint lithography

Residual film in imprint lithography

Imprint lithography using a sparse and dense pattern

Example of a mask of a sparse and dense pattern

An example of the present invention using masks corresponding to a sparse and dense pattern

METHOD OF PRODUCING A MOLD FOR IMPRINT LITHOGRAPHY, AND MOLD

TECHNICAL FIELD

The present invention relates to a method of producing a mold for imprint lithography that is one of lithography processes for a semiconductor or the like, and to a mold produced by the method.

BACKGROUND ART

As illustrated in FIG. 1, imprint lithography is a process in which a mold 1 with a pattern P formed thereon is pressed against a sample 3 coated with an imprintable material 2 having plasticity and curability, whereby an inverted shape of the pattern P is transferred. In the imprint lithography, a thickness of a transferred pattern T formed upon transferring of a shape includes a portion called a residual film F, as illustrated in FIG. 2.

In the imprint lithography, the imprintable material 2 is used as a mask, which requires a process of removing the residual film F. In order to conduct the process of removing the residual film within a short period of time so as not to impair the quality of the mask, it is necessary to form the residual film F thinly and uniformly over the entire imprint region.

According to the imprint lithography, in the case where the sparseness and denseness of the pattern P is uniform, for example, as in patterned media and photonic crystals, it is easy to realize the uniform residual film F. However, in the case where the pattern P has varied sparseness and denseness as illustrated in FIG. 3, it is difficult to form the residual film F in the transferred pattern T uniformly. That is, in the pattern P of the mold 1, when a portion to be formed as a recess in the mold 1 is assumed to be a pattern and the pattern density is higher as the area of the pattern per given area is larger, a pattern on the right side in the figure becomes denser and a pattern on the left side in the figure becomes sparser. When the pattern P of the mold 1 is pressed against the imprintable material 2 with a uniform thickness, as illustrated in FIG. 3(b) from the state illustrated in FIG. 3(a), if the imprintable material 2 does not flow to other portions after entering each corner inside the pattern P, a thickness tR of the residual film F on the right side in the figure, which is a portion of a dense pattern, becomes smaller than a thickness tL of the residual film F on the left side in the figure, which is a portion of a sparse pattern. Thus, the thickness of the residual film F varies depending upon the density of the pattern.

The variation in thickness of the residual film depending upon the sparseness and denseness of a pattern is inevitably caused by the sparseness and denseness of an IC pattern when the pattern is created as an arbitrary circuit configuration with a general IC layout. Therefore, a residual film having different thicknesses is formed at all times, which makes it necessary to perform an operation of removing the residual film for a long period of time until a portion with a large thickness can be removed. This is a waste of time, and in addition, the shape of the thus-formed transferred pattern T is degraded conspicuously. Further, in the case where the non-uniformity of the residual film is large, there may be arose a situation in which the transferred pattern T itself that should remain may be removed. Further, a final residual film distribution can be made uniform, by using an imprintable material with a low viscosity and performing imprint for a longer period of time. However, for this purpose, it is necessary to use a mold and a substrate having ideal flatness, and the above-mentioned uniform state cannot be so expected without a process performed for a very long period of time.

Currently, as a process for forming a residual film uniformly with respect to an arbitrary pattern P, a process is proposed, in which an imprintable material is placed in a state of a number of liquid droplets in an imprint region, and the amount of the liquid droplets are adjusted according to the sparseness and denseness of the pattern at that time. However, this process, for example, requires a complicated mechanism and a limited material for the imprintable material. Thus, this process is not applicable to an arbitrary imprintable material.

Further, regarding the imprint lithography on a substrate uniformly coated with an imprintable material, for example, "Imprint lithography" disclosed in JP-A-2006-303503 ("JP-A" means unexamined published Japanese patent application) proposes that the pattern density is made uniform, for example, by introducing a step of averaging a pattern density in IC layout design, thereby adjusting appropriately the two-dimensional arrangement of a pattern.

Patent Document 1: JP-A-2006-303503

SUMMARY OF THE INVENTION

Problems that the Invention is to Solve

Even if it is possible to introduce the step of making a pattern density uniform in IC layout design, as proposed in Patent Document 1, it is necessary to design a pattern to be imprinted on a mold, taking both a device function and a pattern density into consideration. Further, various processes are proposed to try to moderate the difference between sparseness and denseness, for example, by correcting the size of an existing pattern so as to make the sparseness and denseness uniform, adding a dummy pattern not necessarily required to the vicinity of the existing pattern, or changing the arrangement of the existing pattern. However, those processes can only cope with special cases such as the case where the change in size of a pattern is permitted, the case where a dummy pattern can be added, and the case where a pattern can be rearranged. Thus, the non-uniformity of a pattern density is an essential problem for realizing the imprint lithography.

Meanwhile, in imprint to an imprintable material with a thickness sufficiently large with respect to the depth and height of a mold pattern, and in imprint lithography for dual damascene considering lithography, a stepped mold may be used in some cases. A mold for imprint lithography to be used generally for the purpose of processing a substrate is a mold with a recess having a given depth and a convex having a given height, which general purpose mold is produced by a process using a mask one time, and in the case where a pattern density is non-uniform in imprint lithography using such a mold, a residual film to be formed is also become non-uniform.

Paragraph No. 0072 of the above-mentioned Patent Document mentions the case where a pattern has two or more depths. This is a point to be noted in calculating a pattern density, and merely states that, in a stepped pattern, the addition of a pattern and the movement of a pattern are performed based on the volume of the pattern instead of the area thereof.

It is a main object of the present invention to make a residual film distribution uniform, without changing a size of a pattern and adding a pattern with respect to a desired pattern, and moving a pattern, etc., in regard to the problem of occurrence of the residual film distribution depending upon a pattern density of a mold, which is occurred when an imprintable material having a uniform thickness provided on a substrate is processed with the mold by imprint lithography.

Means to Solve the Problems

In order to solve the above-mentioned problem, according to the present invention, a method of producing an imprint lithography mold by etching using a mask, with mold being used in imprint lithography, which method comprises: etching with a first mask for forming a desired pattern to be formed on the surface of the mold and a second mask for partially covering the first mask, wherein the second mask covers a wider area of openings of the first mask as an opening ratio of the pattern to be formed on the surface of the mold is higher, to thereby make a volume of a recess of the mold in a given area uniform.

In the method of producing an imprint lithography mold according to the present invention, after the mold is etched by the first mask, the etching is further conducted by partially covering the first mask with the second mask without removing the first mask.

In the method of producing an imprint lithography mold according the present invention, the etching is conduced with the first mask and the second mask overlapped from the beginning, thereby to use the second mask as a mask for delaying the etching.

Further, an imprint lithography mold according to the present invention has a pattern in which a depth of a recess of the mold in a given area is varied depending upon a change in an opening ratio of a pattern to be formed on the surface of the mold, to thereby make a volume of the pattern in the given area uniform.

Further, the present invention is directed to a mold produced by the mold production method. Further, the present invention is directed to a reproduced mold in which a pattern of an inverted shape of the mold is formed by said mold. Further, the present invention is directed to a reproduced mold in which a pattern of an inverted shape of the reproduced mold is formed.

Advantageous Effects of the Invention

According to the present invention, with the above-mentioned structures, it is possible to make a residual film distribution uniform, without changing a size of a pattern and adding a pattern with respect to a desired pattern, and moving a pattern, etc., in regard to the problem of the occurrence of the residual film distribution depending upon a pattern density of a mold, which is occurred when an imprintable material having a uniform thickness provided on a substrate is processed with the mold by imprint lithography.

DESCRIPTION OF SYMBOLS

1 mold
2 imprintable material
3 sample
P pattern
T transferred pattern
F residual film
M mask
M1 first mask
M2 second mask

BEST MODE FOR CARRYING OUT THE INVENTION

Figure 4:
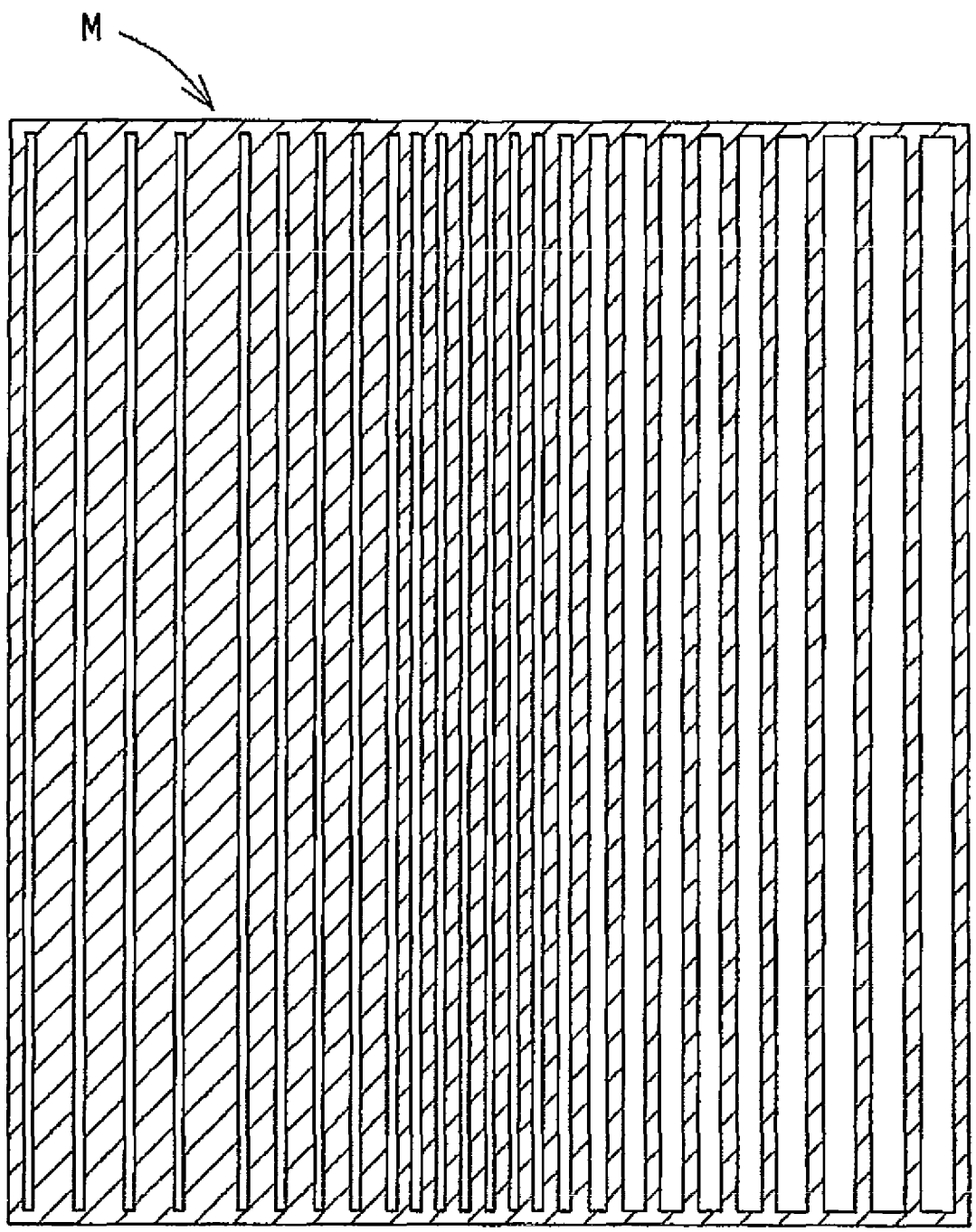
FIG. 4 is a plan view illustrating an example of a mask of a sparse and dense pattern.

Hereinafter, problems in imprint lithography in the case where a pattern density is varied are described first, and the present invention is then described in detail with the explanatory procedures. In the case where a desired pattern, for example, as illustrated in FIG. 4, is formed on a mold by etching, a mask for covering a portion that is not to be etched is provided on the surface of the mold, followed by etching, whereby a desired mold is produced. Although an etching depth is varied slightly depending upon the non-uniformity of etching, the pattern size effect, etc., it may be basically regarded as a uniform depth. This depth is designated to d. In the case where a region with an appropriate given area S is given, and an opening ratio of the mask in the region with the given area S in the surface of the mold is designated to a, a volume V of a recess in the region is expressed as follows by the depth d.

$$V = Sad \quad \text{(Expression 1)}$$

Assuming that imprint is performed with respect to an initial thickness h of an imprintable material using the mold, that the volume of the imprintable material does not change in the area S, and that a residual film b is formed, the following expression is established.

$$Sh = Sb + Sad \quad \text{(Expression 2)}$$

The above expression may be rewritten as follows.

$$b = h - ad \quad \text{(Expression 3)}$$

It is understood that, in the case where the opening ratio a of the mask in the region changes from a minimum value $a_{min}$ to a maximum value $a_{max}$ in the surface of the mold, considering the appropriate given area S in the mask, the residual film takes the maximum value $b_{max}$ when the opening ratio a is minimum and takes the minimum value $b_{min}$ when the opening ratio a is maximum, and the values may be expressed using (Expression 3) as follows.

$$b_{max} = h - a_{min} d \quad \text{(Expression 4)}$$

$$b_{min} = h - a_{max} d \quad \text{(Expression 5)}$$

Considering that a residual film is formed thinly and uniformly, the case where $b_{min} = 0$ in (Expression 5) may be considered, and the initial thickness h in this case is expressed as follows.

$$h = a_{max} d \quad \text{(Expression 6)}$$

The maximum value of the residual film at this time is expressed as follows.

$$b_{max} = (a_{max} - a_{min}) d \quad \text{(Expression 7)}$$

Figure 5:
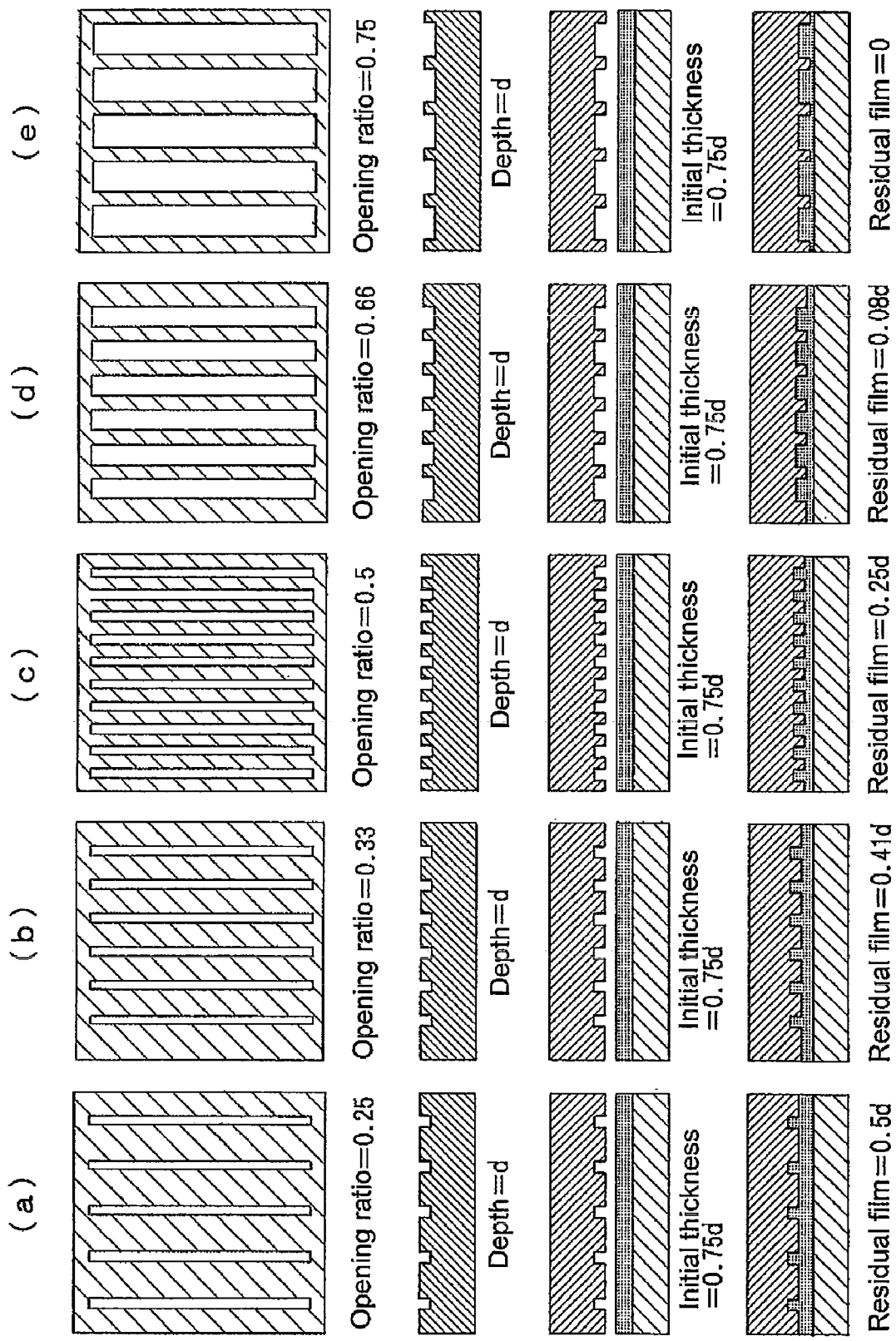
FIG. 5 is an explanatory view of a case where an etching depth is constant irrespective of the sparseness and denseness of a pattern.

If the opening ratio a of a first mask in the region with the given area S at an arbitrary position in the surface of the mold is not constant, $b_{max}$ cannot be set to 0. This causes a problem in imprint lithography. For example, in the case where the opening ratio a at which a certain given area of FIG. 4 is cut out is 0.25, 0.33, 0.5, 0.66, and 0.75, respectively, when imprint lithography is performed with an initial thickness of h=0.75 d at which a residual film becomes 0 in a region with a maximum opening ratio as illustrated in FIG. 5, the residual film takes values of 0.5 d, 0.41 d, 0.25 d, 0.08 d, and 0, respectively. Thus, it is understood that the residual film cannot be 0 in the entire imprint region.

If it is assumed that there might be a technique capable of controlling the etching depth arbitrarily in the surface of the mold, and etching might be conducted so as to render the volume per unit area of an etched recess constant. For this purpose, when the etching depth in a portion with a maximum opening ratio is designated to $d_0$, the etching depth d at an arbitrary position may be set as follows with respect to the opening ratio a in the region.

$$d = (a_{max}/a) d_0 \quad \text{(Expression 8)}$$

When imprint is performed with respect to the imprintable material with the initial thickness h, using the mold thus produced, (Expression 3) may be rewritten as follows.

$$b = h - a(a_{max}/a) d_0 \quad \text{(Expression 9)}$$

$$b = h - a_{max} d_0 \quad \text{(Expression 10)}$$

From (Expression 10), b becomes constant irrespective of a. Here, if an initial thickness satisfying the following expression is adopted, it becomes possible to realize b=0 ideally at any place in the imprint region.

$$h = a_{max} d_0 \quad \text{(Expression 11)}$$

Figure 6:
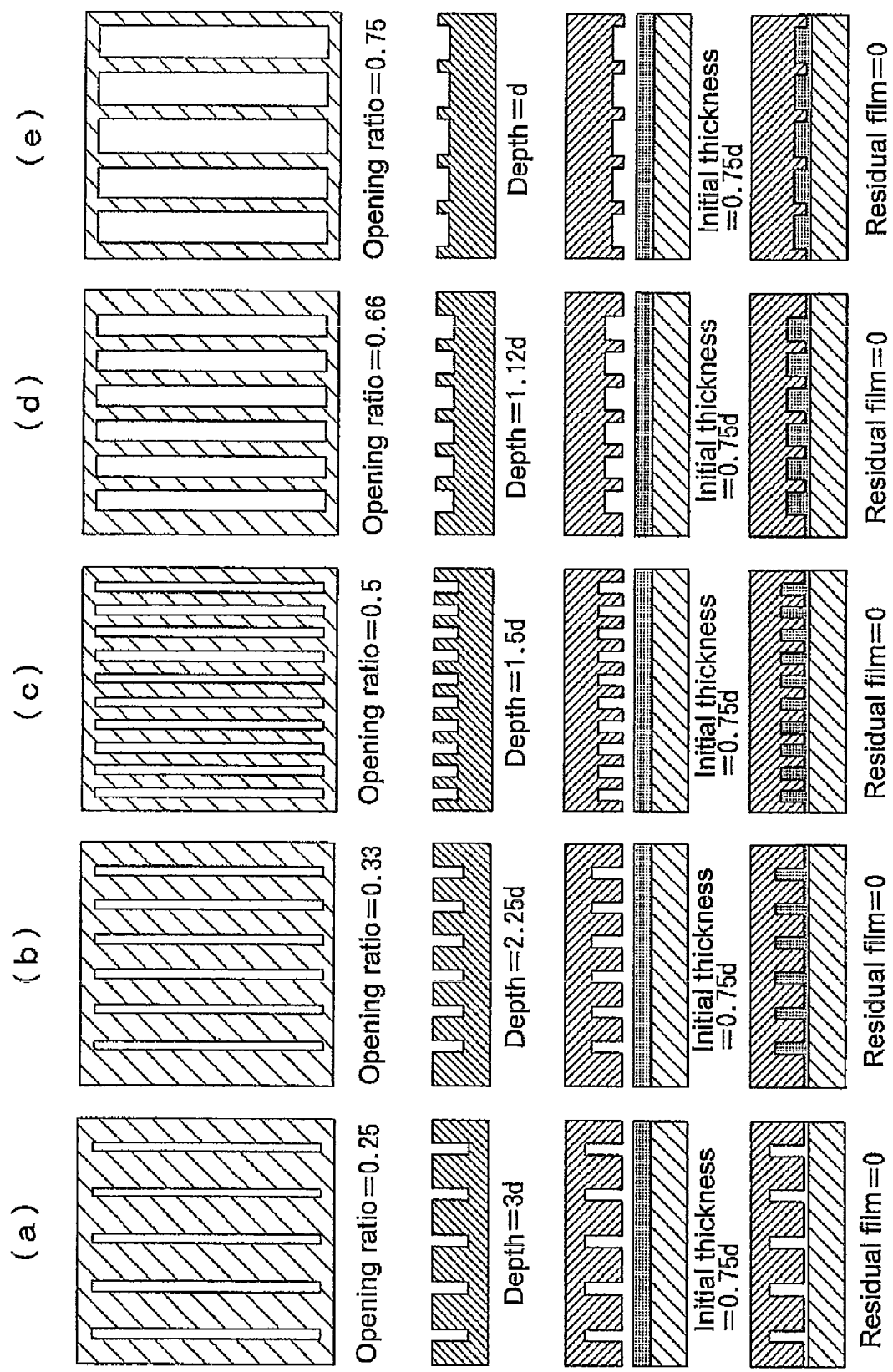
FIG. 6 is an explanatory view of a case where etching is conducted with depths in five different levels depending upon the sparseness and denseness of the pattern.

An example in this case is illustrated in FIG. 6. The problem can be solved theoretically by this method. However, in a procedure of combining a general mask with etching, the etching depth cannot be controlled freely depending upon the place, and this etching cannot be realized using one mask. Further, in a procedure of combining a mask with etching depending upon an opening ratio, it is necessary to provide a respective mask for the respective opening ratio, and 5 kinds of masks are required in this case. Considering a general pattern, more masks may be required, which increases the number of processes conspicuously. Further, ensuring the overlapping precision of those masks becomes a problem.

Next, examples according to the present invention having similar effects in a simple manner are described using a general etching procedure. Here, 2 kinds of masks are used. A mask for forming a desired pattern is referred to as a first mask. Etching of the depth d is conducted with the first mask. Further, a second mask is provided while the first mask is left, and additional etching of a depth cd is to be conducted. Considering the appropriate given area S, the combined opening ratio of the first mask and the second mask in the region with the given area S at a certain position in the surface of the mold is assumed to be x. Assuming that the opening ratio of the region by the first mask is a, the combined opening ratio is equal to or less than the a. Therefore, the range x can take is expressed as follows.

$$0 \leq x \leq a \quad \text{(Expression 12)}$$

Further, the etching of the depth cd is conducted additionally, and hence the volume V of the recess in the region can be expressed as follows.

$$V = Sad + Sxcd \quad \text{(Expression 13)}$$

Assuming that a residual film b is formed as a result when imprint is performed with respect to the initial thickness h of the imprintable material, and the total amount of a resin does not change in the area S, the following expression is satisfied.

$$Sh = Sb + Sad + Sxcd \quad \text{(Expression 14)}$$

The residual film b is expressed as follows.

$$b = h - (a + xc) d \quad \text{(Expression 15)}$$

Here, assuming that additional etching is not conducted in a region in which the opening ratio of the first mask is largest, the second mask may cover all the openings of the first mask in that region, and the combined opening ratio x is 0. In this case, (Expression 15) becomes the same as (Expression 10) as follows.

$$b = h - a_{max} d \quad \text{(Expression 16)}$$

Further, in order for the residual film in this region to become 0, the following relationship:

$$h = a_{max} d \quad \text{(Expression 17)}$$

may be adopted as the initial thickness. At this time, the residual film b at an arbitrary position is expressed as follows by substituting (Expression 17) into (Expression 15).

$$b = a_{max} d - (a + xc) d \quad \text{(Expression 18)}$$

In order to satisfy b=0 in this case, x should satisfy the following condition.

$$x = (a_{max} - a)/c \quad \text{(Expression 19)}$$

When a takes the range from $a_{min}$ to $a_{max}$, the minimum value $x_{min}$ and the maximum value $x_{max}$ of x are expressed as follows.

$$x_{min} = 0 \quad \text{(Expression 20)}$$

$$x_{max} = (a_{max} - a_{min})/c \quad \text{(Expression 21)}$$

Those x are required to satisfy (Expression 12). Consequently, the condition required for this purpose is as follows.

$$(a_{max} - a_{min})/c \leq a_{min} \quad \text{(Expression 22)}$$

The above expression may be rewritten as follows.

$$c \geq a_{max}/a_{min} - 1 \quad \text{(Expression 23)}$$

Consequently, if c satisfying (Expression 23) can be adopted, the opening ratio x corresponding to a can be realized by the second mask according to (Expression 19), and the residual film b can be 0 irrespective of the opening ratio a of the first mask.

Here, if it is considered that the required minimum etching is conducted, the minimum c should be adopted, which is expressed as follows.

$$c = a_{max}/a_{min} - 1 \quad \text{(Expression 24)}$$

Under this condition, (Expression 19) becomes as follows.

$$x = a_{min}(a_{max} - a)/(a_{max} - a_{min}) \quad \text{(Expression 25)}$$

Figure 1:
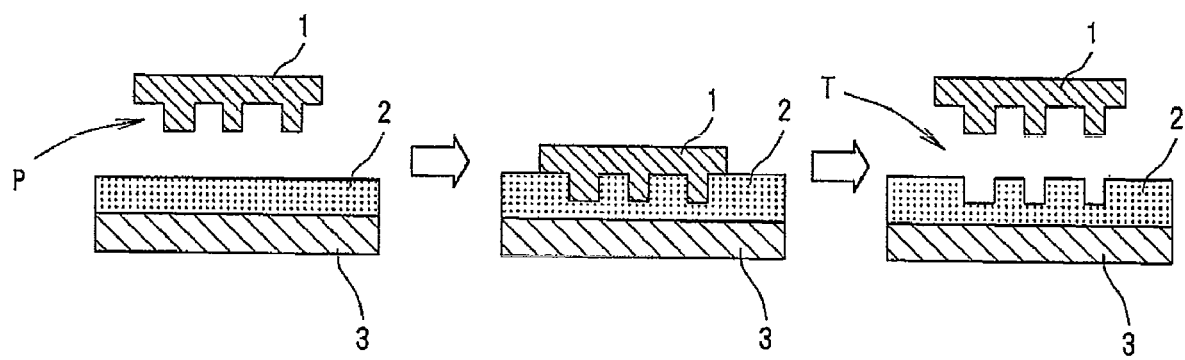
FIG. 1 is a cross-sectional view illustrating imprint lithography.
Figure 2:
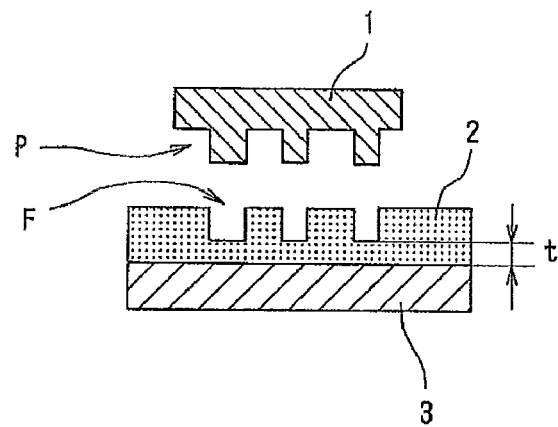
FIG. 2 is a cross-sectional view illustrating a residual film in imprint lithography.
Figure 3:
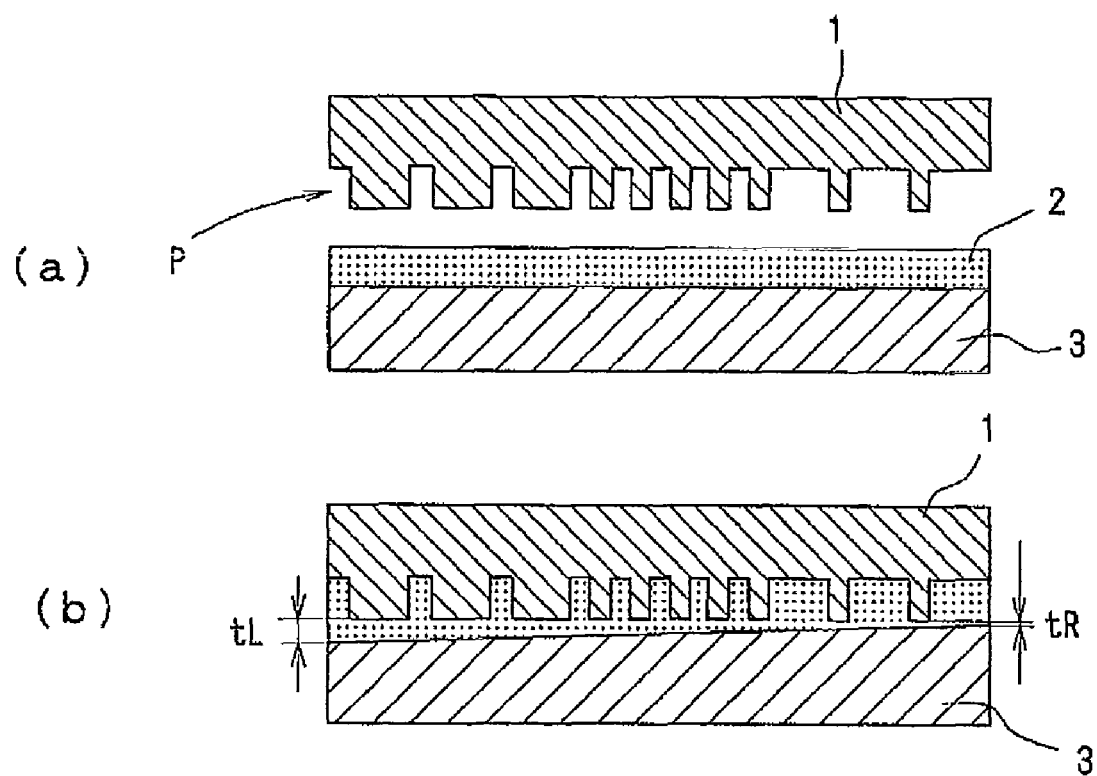
FIG. 3 is a cross-sectional view illustrating a state of imprint lithography using a sparse and dense pattern.
Figure 7:
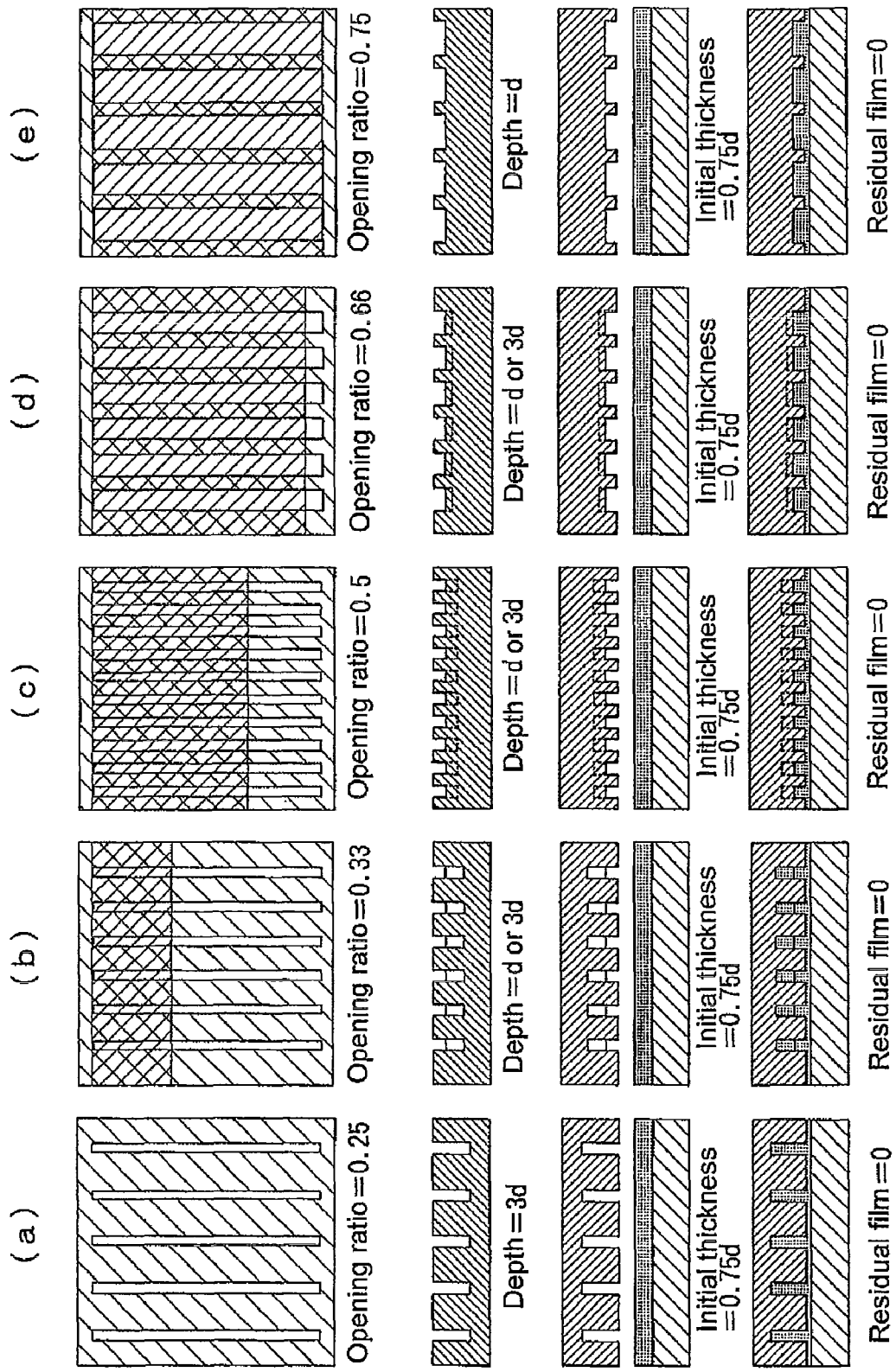
FIG. 7 is an explanatory view of a case where etching is conducted with depths in two different levels, adding a mask, depending upon the sparseness and denseness of the pattern.
Figure 8:
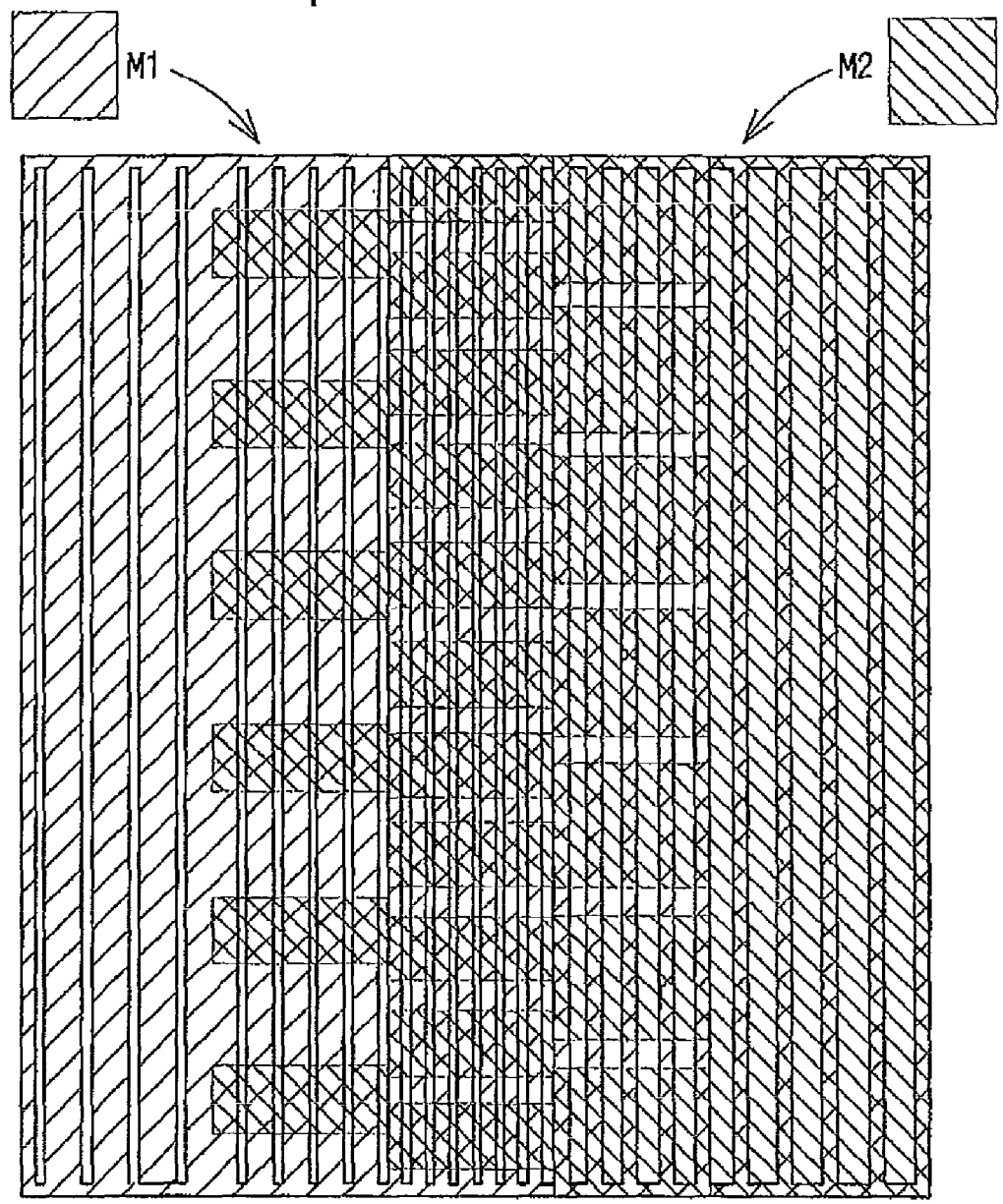
FIG. 8 is a plan view illustrating an example of a mask pattern for making a volume of a recess of the mold per unit area of the sparse and dense pattern uniform.

In principle, such an opening ratio can be realized without fail. In a portion in which the opening ratio of the first mask is minimum, the second mask is placed so as not to cover the openings at all, in a portion in which the opening ratio of the first mask is maximum, the second mask is placed so as to cover all the openings, and in the other cases, the second mask partially covers the openings of the first mask. Consequently, it is understood that the volume per unit area of a recess etched by two-stage etchings according to the above can be constant, and the mold produced based on the above can set the residual film to 0 in the entire imprint region. An example in this case is illustrated in FIG. 7. A second mask that is to have a combined opening ratio obtained by calculation from the opening ratio of the first mask is provided, followed by etching, whereby 5 kinds of opening ratios are supported here. Consequently, the second mask as illustrated in FIG. 8 may be provided, for the sparse and dense pattern illustrated in FIG. 3. Even in the case of a general pattern having an opening ratio in stages equal to or more than that of the general pattern, the second mask can be provided without any problem according to (Expression 25), and hence, the entirely same process can be performed.

Here, considering a pattern whose opening ratio distribution varies largely in the surface of the mold, the value of $a_{max}/a_{min}$ in (Expression 23) is very large, and hence, c is also very large, and additional etching of the depth cd may not be conducted in practice. In this case, the residual film over the entire imprint region cannot be set to 0 in this procedure. However, even in this case, when the second mask is placed at $x=a_{min}$, i.e., so as not to cover the openings of the first mask at all in the region of $a=a_{min}$ where the maximum residual film is given, the maximum residual film can be expressed from (Expression 18) in this case as follows.

$$b = a_{max}d - (a_{min} + a_{min}c)d \qquad \text{(Expression 26)}$$

It is understood that the residual film can be made thinner by $a_{min}cd$ than the maximum value $(a_{max} - a_{min})d$ of the residual film formed only in the first mask expressed by (Expression 7), and the result can be obtained in which the residual film is made more uniform by this procedure for imprint lithography.

In the above description, for clarifying the description, the thickness that sets a residual film of an imprintable material to 0 is utilized as an initial thickness. However, for practical use, an initial thickness at which a residual film is slightly formed is used in imprint lithography. In this case, it is expected that a residual film is formed, which residual film has a uniform thickness having a thickness of the difference between the used initial thickness and the initial thickness giving 0 residual film. Further, in the description above, it is assumed that the depth of a pattern to be formed by the first mask is constant, but the depth of a pattern formed in the first mask openings may not be uniform, upon additional processing with respect to a mold which has already been processed, and the like. In this case, the volume in the case of only the first mask in the region may be calculated instead of Sad in (Expression 13), and the volume formed by the second mask may be calculated instead of Sxcd, whereby the second mask may be designed so that the total thereof becomes constant at any place in the surface of the mold.

Hereinafter, examples of the process that can be realized by the present invention are described. For example, in producing a mold for UV imprint lithography, a Cr film is formed on a quartz substrate to be a mold, the Cr film is coated with a resist for an electron beam, a circuit pattern is generated and developed by electron beam drawing, and a pattern is engraved on quartz by Cr etching using the resist for an electron beam as a mask and quartz etching using Cr as a mask. Generally, by removing the Cr mask at this timing, a general UV imprint lithography mold with a constant etching depth is completed. However, in the present invention, the Cr mask is not removed at this timing. The Cr mask not removed at this timing corresponds to the first mask in the present invention.

An etched quartz substrate with Cr attached thereto produced by the above-mentioned process, as the first mask, is, for example, coated with a photoresist, or is, for example, drawn an etching-blocking pattern thereon based on the above description by laser drawing followed by subjecting to development, thereby to form a second mask. Then, the thus-produced substrate is subjected to quartz etching, thereby to further etch only a portion of the quartz, which portion corresponds to not only the openings of the first mask but also the openings of the second mask, to a desired depth. Then, by removing the photoresist and Cr, a mold having stages of the etching depth is completed, in which the volume of a recess of the mold in a given area at an arbitrary position in the surface of the mold based on the present invention, is almost constant or made more uniform as compared with the case of using only the first mask.

In the above-mentioned examples, the first procedure is used so as to realize the present invention. However, a second procedure can be realized, by appropriately selecting the thickness of a photoresist in the above paragraph No. 0025 without conducting quartz etching described in the above paragraph No. 0024. In this case, a photoresist, which is the openings of the Cr as the first mask and which is the second mask, serves to delay etching and can delay the start of the quartz etching in the portion by the time period during which the photoresist is completely removed upon the quartz etching process. Thus, a mold having stages of the etching depth is completed, in which the volume of a recess of the mold in a given area at an arbitrary position in the surface of the mold, is almost constant or made more uniform as compared with the case of using only the first mask.

Here, an example of the UV imprint lithography mold has been described. However, any substrate, mask material, and lithography procedure can be used. Further, as recited in claims 6 and 7, the mold produced by the above-mentioned procedure or an inverted shape of a desired mold may be produced by the above-mentioned procedure, and a mold having depths in desired multiple stages can also be produced by a reproduction process of forming an inverted shape reflecting the multi-stage depths.

According to the present invention, a pattern is produced in which the volume of the pattern in a given area is made uniform, by changing the depth of a mold pattern recess to be formed on the mold surface of an imprint lithography mold, to form a multi-stage shape. In addition to the above, the present invention is also applicable to a reproduced mold, which is produced by a procedure including reproduction means for forming an inverted shape reflecting the multi-stage form of a mold, by a procedure using the mold, such as imprinting, embossing, injection molding, plating, casting, and the like.

The invention claimed is:

1. A method of producing a mold having recesses for imprint lithography, by etching with two masks, with the mold being used in imprint lithography, comprising:
   etching with a first mask having openings, to form a desired pattern of the recesses to be formed on the surface of the mold, and with a second mask to partially cover the openings of the first mask, in which the openings of the first mask each have an opening ratio different from each other, wherein, the following three conditions are met: (1) in a portion in which the opening ratio of the openings of the first mask is minimum, the second mask is not placed on the first mask so as not to cover the openings of the first mask at all: (2) in a portion in which the opening ratio of the openings of the first mask is maximum, the second mask is placed on the first mask so as to cover the entire openings of the first mask: and (3) in other portions in which the opening ratios of the openings of the first mask are more than the minimum but not more than the maximum, the second mask is placed on the first mask so as to partially cover the openings of the first mask, depending on the opening ratio of the first mask such that the second mask covers a wider area of the openings of the first mask as an opening ratio of the desired pattern to be formed on the surface of the mold by the first mask is higher, thereby to make a volume of the respective recess to be formed on the mold in a given area uniform and to make a residual film distribution uniform regardless of the opening ratio of the desired pattern.

2. The method of producing a mold having recesses for imprint lithography according to claim 1, which comprises, after etching the mold with the first mask, further etching with partially covering the openings of the first mask with the second mask without removing the first mask.

3. The method of producing a mold having recesses for imprint lithography according to claim 1, wherein the etching is conducted with the first mask and the second mask overlapped from the beginning, thereby to use the second mask as a mask for delaying the etching.

* * * * *